(12) United States Patent
Ishihara

(10) Patent No.: US 6,919,593 B2
(45) Date of Patent: Jul. 19, 2005

(54) SEMICONDUCTOR MEMORY DEVICE AND METHOD OF FABRICATING THE SAME

(75) Inventor: Kazuya Ishihara, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 236 days.

(21) Appl. No.: 10/213,374

(22) Filed: Aug. 7, 2002

(65) Prior Publication Data

US 2003/0030085 A1 Feb. 13, 2003

(30) Foreign Application Priority Data

Aug. 9, 2001 (JP) ..................................... 2001-241921

(51) Int. Cl.⁷ ............................................ H01L 27/108
(52) U.S. Cl. .......................... 257/295; 257/296; 438/3
(58) Field of Search .............................. 257/295, 296, 257/195, 196; 438/3

(56) References Cited

U.S. PATENT DOCUMENTS

| 5,481,490 | A | 1/1996 | Watanabe et al. |
| 5,638,319 | A | 6/1997 | Onishi et al. |
| 6,204,070 | B1 * | 3/2001 | Kim ............................... 438/3 |
| 6,740,531 | B2 * | 5/2004 | Cho et al. ...................... 438/3 |
| 2003/0155655 | A1 * | 8/2003 | Fitzsimmons et al. ...... 257/774 |

FOREIGN PATENT DOCUMENTS

| JP | 7-111318 A | 4/1995 |
| JP | 8-335673 A | 12/1996 |
| JP | 10-294433 A | 11/1998 |

* cited by examiner

*Primary Examiner*—David Nelms
*Assistant Examiner*—Long Tran
(74) *Attorney, Agent, or Firm*—Nixon & Vanderhye P.C.

(57) ABSTRACT

A ferroelectric capacitor having a ferroelectric film is formed on a conductive silicon substrate. The dielectric capacitor is covered with a first diffusion barrier film, and a second interlayer insulating film is formed on the first diffusion barrier film. A first metal wiring is formed on the second interlayer insulating film, and the first metal wiring is covered with a first buffer film. A second diffusion barrier film is formed on the first buffer film, and a third interlayer insulating film is formed on the second diffusion barrier film. A second metal wiring is formed on the third interlayer insulating film, and the second metal wiring is covered with a second buffer film. A third diffusion barrier film is formed on the second buffer film.

19 Claims, 8 Drawing Sheets

SEMICONDUCTOR MEMORY DEVICE AND METHOD OF FABRICATING THE SAME

BACKGROUND OF THE INVENTION

The present invention relates to a semiconductor memory device and a method of fabricating the same.

A ferroelectric film is applied in a wide range of devices since it has many properties such as spontaneous polarization, high permittivity, electro-optical effect, piezoelectric effect, pyroelectric effect and so forth. For example, the ferroelectric film is used in various fields such as an infrared linear array sensor by utilizing its pyroelectricity, an ultrasonic sensor by utilizing its piezoelectricity, a waveguide optical modulator by utilizing its electro-optical effect and a dynamic random access memory (hereinafter, referred to as DRAM) by utilizing its ferroelectricity.

Above all, with the advancement of thin film formation techniques in recent years, a ferroelectric nonvolatile memory (FRAM), which has a high density and operates at a high speed, is actively being developed by using ferroelectric techniques and semiconductor memory techniques in combination. Nonvolatile memories using a ferroelectric film are actively being researched and developed for practical use as memories that can replace not only conventional nonvolatile memories, but also static RAMs (SRAMs) and DRAMs, due to their characteristics such as high-speed writing/reading, low-voltage operation and writing/reading resistance.

In order to develop such devices, a material is required which has properties such as high remanent polarization, low coercive field, low leakage current and high resistance to repeated polarization reversals. Furthermore, it is desirable to realize the aforementioned properties in a thin film having a thickness of 200 nm or less to match a lower operating voltage and a semiconductor fine processing process. As a ferroelectric material used for these devices, a bismuth lamella structure compound thin film such as lead zirconate titanate (($Pb_xLa_{1-x}$) ($Zr_yTi_{1-y}$)$O_3$ ($0 \leq x$, $y \leq 1$) (hereinafter, referred to as PZT)) and $SrBi_2$ ($Ta_xNb_{1-x}$)$_2O_9$ ($0 \leq x \leq 1$) (hereinafter, referred to as SBT) is suitable for application to ferroelectric and high dielectric integrated circuits.

Meanwhile, in order to increase capacitance of a capacitor in response to higher integration of DRAMs, high dielectric materials, which are materials having higher permittivity than that of a conventionally used silicon oxide film, such as tantalum oxide (hereinafter, referred to as $Ta_2O_5$) film, strontium titanate (hereinafter, referred to as $SrTiO_3$), barium strontium titanate and so forth are to be used for future highly integrated DRAMs of 256 megabits to 1 gigabit or higher and are being actively researched and developed.

A conventional semiconductor memory device including a capacitor made of a ferroelectric film is shown in FIG. 4. This semiconductor memory device is fabricated as follows.

First, a gate oxide film 103 of a selection transistor for reading/writing a memory is formed on a conductive silicon substrate 101 having source/drain regions 104, 104 and a device isolation region 102, and a polysilicon word line 105 is formed on the gate oxide film 103.

Then, a material of an interlayer insulating film 106 is deposited on the polysilicon word line 105 and the conductive silicon substrate 101, and then Ti or an oxide of Ti, which is a material of an adhesion layer 107 for a Pt lower electrode 108, is deposited.

Then, the Pt lower electrode 108, a ferroelectric film 109 and a Pt upper electrode 110 are formed by dry etching to complete a dielectric capacitor consisting of the lower electrode 108, ferroelectric film 109 and upper electrode 110.

Then, a first diffusion barrier film 111 made of an oxide of Ti, Al, Zr or the like is formed so as to cover the whole ferroelectric capacitor. This first diffusion barrier film 111 prevents a reaction between the ferroelectric film 109 and a second interlayer insulating film 112 and diffusion of hydrogen generated upon the formation of the second interlayer insulating film 112 into the ferroelectric capacitor.

Subsequently, an interlayer insulating film layer 112 such as a silicon oxide film or the like is formed on the first diffusion barrier film 111.

Then, a contact hole 115 is formed to connect the Pt upper electrode 110 of the ferroelectric capacitor and the source/drain regions 104 of the selection transistor with a first metal wiring 113. Then, the first metal wiring 113 made of Al or the like is provided to interconnect the Pt upper electrode 110 and the source/drain regions 104.

Finally, a surface protection film layer 114 such as a silicon nitride film is formed and sintered at around 400° C. in an atmosphere containing 2–5% hydrogen as a final thermal treatment.

Ferroelectric films and high dielectric films are easily reduced when they are brought into contact with hydrogen, and metals such as Pt, Ir and the like, which are materials of an electrode in contact with a ferroelectric film or a high dielectric film, have a catalytic effect of promoting a strong reduction reaction. Therefore, when hydrogen is adsorbed to the electrode, hydrogen is activated and diffused into the ferroelectric film, and the ferroelectric film is easily reduced.

Generally, a process for fabricating a semiconductor memory device having a dielectric film in a capacitor includes a lot of process steps where hydrogen is generated. An interlayer insulating film formed on the high dielectric capacitor or the ferroelectric capacitor is usually formed by a chemical vapor deposition method (hereinafter, referred to as CVD method) using silane (hereinafter, referred to as $SiH_4$) as a main source. In this case, when the interlayer insulating film is formed, the source is decomposed and hydrogen is generated. When this hydrogen is diffused into the ferroelectric capacitor or the high dielectric capacitor, the ferroelectric film or the high dielectric film is reduced, thereby increasing a leakage current or lowering the remanent polarization value. As a method of preventing deterioration due to the hydrogen diffusion, there is a method wherein the whole ferroelectric capacitor is covered with a first diffusion barrier film 111 made of an oxide of Ti, Al, Zr or the like as in the case of the semiconductor memory device shown in FIG. 4. In addition to this method, it is effective to cover the ferroelectric capacitor or the high dielectric capacitor with a diffusion barrier film made of an oxide of Ti, Al, Ta or the like as disclosed in Japanese Patent Laid-Open Publication Nos. 8-335673 and 10-294433.

Meanwhile, since a layout of memory cells and peripheral circuits is complicated in a semiconductor memory device having a degree of integration of one megabit or higher, two or more layers of metal wirings are required.

FIG. 5 is a cross sectional view showing a semiconductor memory device using two-layer metal wirings. In FIG. 5, the same component members as those in FIG. 4 are designated by the same reference numerals and their explanation is omitted.

First and second metal wirings 113, 213 shown in FIG. 5 are usual aluminum wirings. After the first metal wiring 113 in the first layer is formed, a third interlayer insulating film 212, which is a silicon oxide film, is provided by the CVD method. Then, after a material of the second metal wiring 213 in the second layer is deposited on the third interlayer insulating film 212, the second metal wiring 213 in the second layer is formed by a reactive ion etching method by using a photoresist as a mask. When an aluminum wiring in the third layer is formed, an interlayer insulating film is similarly provided on the second metal wiring 213 in the second layer, and the aluminum wiring in the third layer is formed on this interlayer insulating film.

Since the second and third interlayer insulating films 112, 212 are formed by the CVD method using $SiH_4$ as a main source, the source is decomposed during the formation of the layers, and hydrogen is generated. Furthermore, since the second and third interlayer insulating films 112, 212 are formed at around 400° C., hydrogen remains in the films, and hydrogen is released from the second and third interlayer insulating films 112, 212 during a thermal treatment process after the formation of the second and third interlayer insulating films 112, 212 and further during a thermal process in the formation of the upper, third interlayer insulating film 212. Thus, since a large amount of hydrogen is generated during the process of forming aluminum wirings in a plurality of layers, that is, the process of forming the first and second metal wirings 113, 213, it is difficult to obtain a sufficient barrier property only by the first diffusion barrier film 111 formed so as to cover the ferroelectric capacitor, and hence a problem arises that a capacitor characteristic is deteriorated.

As a method of preventing this deterioration of the capacitor characteristic, a method may be conceived wherein a diffusion barrier film is formed so as to cover the first and second metal wirings 113, 213, thus preventing diffusion of hydrogen. However, since the covering ability of the diffusion barrier film for a stepped surface is poor as long as the diffusion barrier film is formed by a sputtering method, the thickness of the diffusion barrier film covering side surfaces of the first and second metal wirings 113, 213 becomes about 50–70% of the thickness of the diffusion barrier film on top of the first and second metal wirings 113, 213.

Furthermore, a method is also conceivable wherein the thickness of the diffusion barrier film covering the side surfaces of the first and second metal wirings 113, 213 is increased to prevent deterioration of the capacitor characteristic. However, since the diffusion barrier film is a dense film, its film stress is large. Thus, if the thickness of the diffusion barrier film is increased to secure its barrier property for the side surfaces of the first and second metal wirings 113, 213, reliability of the first and second metal wirings 113, 213 will disadvantageously be deteriorated.

Furthermore, the diffusion barrier film covering the first and second metal wirings 113, 213 is effective when it is formed from an oxide of Al, nitride of Al, oxynitride of Al, oxide of Ta, oxynitride of Ta, oxide of Ti or oxide of Zr. The film is formed by a reactive sputtering method using a mixed gas of Ar and oxygen. However, since oxygen atoms become negative ions during formation of the diffusion barrier film, charges are easily accumulated on the substrate or wafer. If such charges are accumulated in the first metal wiring 112 connected to the capacitor, a high voltage may be applied to the capacitor, resulting in a dielectric breakdown.

SUMMARY OF THE INVENTION

Accordingly, an object of the present invention is to provide a highly reliable semiconductor memory device capable of preventing deterioration of a dielectric film, and a method of fabricating the same.

In order to accomplish, a semiconductor memory device according to an aspect of the present invention comprises:

a semiconductor substrate;

a dielectric capacitor that is formed on the semiconductor substrate and has a dielectric film;

a first diffusion barrier film covering the dielectric capacitor;

an insulating film formed on the first diffusion barrier film;

a first metal wiring formed on the insulating film;

a first buffer film covering the first metal wiring; and a second diffusion barrier film formed on the first buffer film.

According to the semiconductor memory device having the above constitution, because the second diffusion barrier film is formed on the first metal wiring via the first buffer film, uniformity in the thickness of the second diffusion barrier film becomes favorable, and diffusion of a harmful substance from above the second diffusion barrier film towards the dielectric film is reliably prevented by the second diffusion barrier film even if the thickness of the second diffusion barrier film is not large. Therefore, the dielectric film is not adversely affected by the harmful substance, and hence the dielectric film is prevented from deterioration.

Furthermore, since the thickness of the second diffusion barrier film is not large, reliability of the first metal wiring is prevented from deterioration.

In one embodiment, the semiconductor memory device further comprises:

an insulating film formed on the second diffusion barrier film;

a second metal wiring formed on the insulating film on the second diffusion barrier film;

a second buffer film covering the second metal wiring; and a third diffusion barrier film formed on the second buffer film.

According to the semiconductor memory device having the above constitution, since the second and third diffusion barrier films are formed on the first and second metal wirings via the first and second buffer films, uniformity in the thickness of the second and third diffusion barrier films becomes favorable, and even if the thickness of each of the second and third diffusion barrier films is not large, diffusion of a harmful substance from above the second and third diffusion barrier films towards the dielectric film is reliably prevented by the second and third diffusion barrier films. Therefore, the dielectric film is not adversely affected by the harmful substance, and hence deterioration of the dielectric film is prevented.

Furthermore, since the thickness of each of the second and third diffusion barrier films is not large, reliability of the first and second metal wiring is prevented from deteriorating.

The dielectric film may be a ferroelectric film formed by using any one of $(Pb_xLa_{1-x})(Zr_yTi_{1-y})O_3$ ($0 \leq x, y \leq 1$), $Bi_4Ti_3O_{12}$, $BaTiO_3$, $LiNbO_3$, $LiTaO_3$, $YMnO_3$, $Sr_2Nb_2O_7$, and $SrBi_2(Ta_xNb_{1-x})_2O_9$ ($0 \leq x \leq 1$).

Alternatively, the dielectric film may be a high dielectric film formed by using any one of $SrTiO_3$, $(Ba_xSr_{1-x})TiO_3$ ($x \leq 1$), and $Ta_2O_5$.

Each of the buffer films may comprise an insulating film made of any one of a compound of Si and oxygen, a compound of Si and nitrogen, and a compound of Si, nitrogen and oxygen.

In this case, $Si(OC_2H_5)_4$ can be used as a Si source.

In one embodiment, the above buffer films each have a thickness of 100–300 nm.

Each of the diffusion barrier films may be formed from any one of an oxide of Al, a nitride of Al, an oxynitride of Al, an oxide of Ta, an oxynitride of Ta, an oxide of Ti, and an oxide of Zr.

In one embodiment, each diffusion barrier film has a thickness of between 10 nm and 100 nm inclusive and each diffusion barrier film is amorphous or comprises grains having a grain size of 5 nm or smaller.

In one embodiment, each diffusion barrier film has a refractive index of 1.60 or higher but lower than 1.75, and comprises any one of an oxide of Al, a nitride of Al, and an oxynitride of Al.

The present invention also provides a method of fabricating a semiconductor memory device comprising:

forming a dielectric capacitor having a dielectric film on a semiconductor substrate;

forming a metal wiring on a top layer of the dielectric capacitor;

successively forming a buffer film and a diffusion barrier film on the metal wiring; and after the diffusion barrier film is formed, performing a thermal treatment at a temperature between 300° C. and 450° C. inclusive in an ambient of oxygen, nitrogen or of a mixed gas thereof.

According to the semiconductor memory device fabricating method, after the diffusion barrier film is formed, a thermal treatment is performed at a temperature between 300° C. and 450° C. inclusive in the ambient of oxygen or nitrogen or a mixed gas thereof. Consequently, in the diffusion barrier film, a stoichiometric composition ratio for a stable film composition is obtained, and denseness and insulativity of the film is improved. As a result, the barrier property against diffusion of hydrogen becomes favorable.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (Embodiment 1)

FIGS. 1A–1G are cross sectional views showing process steps of fabricating a semiconductor memory device according to Embodiment 1 of the present invention. This semiconductor memory device is a planar-type ferroelectric memory device using two-layer Al wiring.

Hereafter, a method of fabricating this semiconductor memory device will be explained with reference to FIGS. 1A–1G.

Figure 1A:
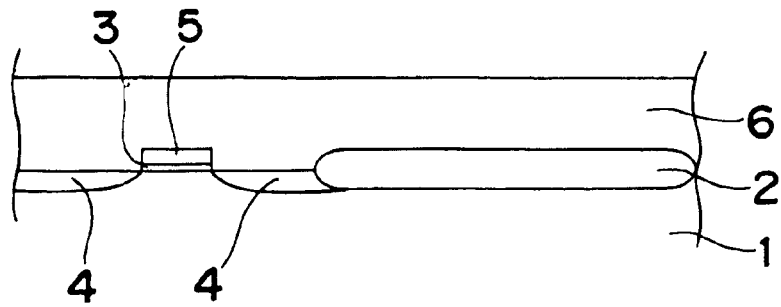
FIGS. 1A–1G are cross sectional views showing fabricating processes of a semiconductor memory device according to Embodiment 1 of the present invention.

First, as shown in FIG. 1A, a device isolation region 2, gate oxide film 3 of a selection transistor, source/drain regions 4 of a transistor, gate electrode 5 to be used as a polysilicon word line are successively formed on a conductive silicon substrate 1 by a known method, and then the whole surface is covered with a first interlayer insulating film 6 made of a known BPSG film (Boro-Phospho Silicate Glass film).

Figure 1B:
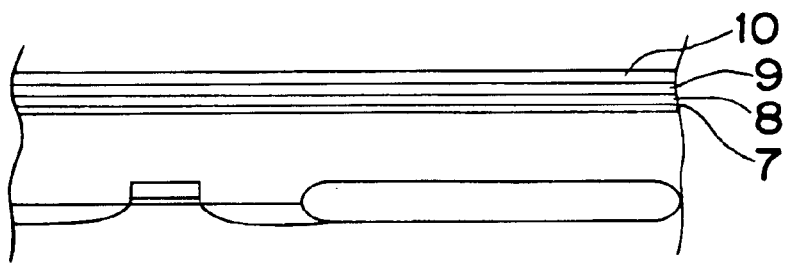

Then, as shown in FIG. 1B, Ti oxide 7 is deposited to 30 nm by a known sputtering method to form an adhesion layer for a lower electrode, and Pt, which is a material of a lower electrode, is deposited 100–200 nm on the Ti oxide 7. Then, a ferroelectric film 9 made of SBT is formed on the Pt film 8. A precursor solution prepared so that the concentration of $SrBi_2Ta_2O_9$ is 0.1 mol/1 is used to form the ferroelectric film 9. The top surface of the Pt film 8 is coated with this precursor solution by a known spin coating method. Subsequently, in order to completely remove the solvent, a drying treatment is performed on a hot plate heated to 250° C., and then the film is baked in an electric heating furnace at temperature between 600° C. and 700° C. inclusive. A ferroelectric film 9 having a thickness of 200 nm is obtained by repeating such a film formation process three times. Then, Pt, which is a material of an upper electrode, is deposited 100 nm on the ferroelectric film 9 to form a Pt film 10 for forming a Pt upper electrode.

Figure 1C:
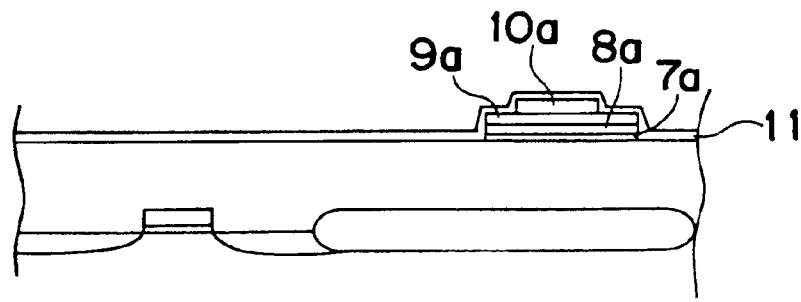

Subsequently, the Pt film 10 is processed into a 1.5 $\mu$m by 1.5 $\mu$m square by a known ultraviolet reduction exposure technique (hereinafter, referred to as photolithography) using a photoresist and a dry etching method, to thereby form the Pt upper electrode 10a to be a capacitor electrode as shown in FIG. 1C. In this case, a $Cl_2$ gas is typically used as an etching gas, the etching pressure is maintained at 1.5 mTorr, plasma is generated by microwave excitation, and a high frequency bias is applied to a substrate on which the conductive silicon substrate 1 is set to process the Pt film 10. Then, a thermal treatment is performed in an electric heating furnace at 700–800° C. in an oxygen atmosphere.

Then, the adhesion layer 7, Pt film 8 and ferroelectric film 9 are processed by a known photolithography using a photoresist and the dry etching method to obtain an adhesion layer 7a, Pt lower electrode 8a and ferroelectric film 9a. In this case, a $C_2F_6$ gas is typically used as an etching gas to process the adhesion layer 7, Pt film 8 and ferroelectric film 9.

Subsequently, in order to prevent diffusion of $H_2$, a first diffusion barrier film 11 is formed from an oxide of Al or a nitride of Al so as to cover the Pt lower electrode 8a, ferroelectric film 9a and Pt upper electrode 10a with the first diffusion barrier film 11. In this case, the first diffusion barrier film is formed by a DC magnetron sputtering method, RF magnetron sputtering method or a sputtering method using electron cyclotron resonance as a plasma source and by using any one of an Al target, an Al oxide target and an Al nitride target. With the substrate temperature maintained between 25° C. and 400° C. inclusive, gases are introduced into a film formation chamber at a mixture ratio of $O_2/(O_2+Ar)$ in the range of 0.1–0.5 and the pressure is set in the range of 1–20 mTorr to form the first diffusion barrier film 11. Furthermore, the film thickness of the first diffusion barrier film 11 is made between 10 nm and 100 nm inclusive, and the substrate temperature when the first diffusion barrier film 11 is formed is set at 100–400° C.

Figure 1D:
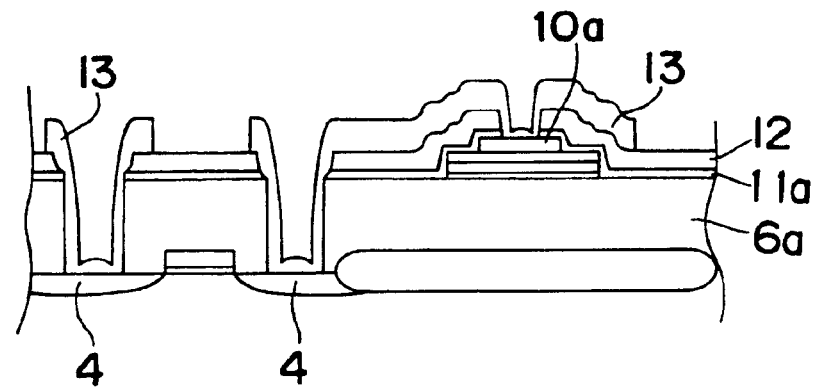

Subsequently, in order to form a second interlayer insulating film 12 as shown in FIG. 1D, an oxide film having a thickness between 500 nm and 600 nm inclusive is formed on the first diffusion barrier film 11 by a atmospheric CVD method inducing a reaction between an organic silicon compound such as, for example, tetraethoxysilane (Si(OC$_2$H$_5$)$_4$) (hereinafter, referred to as TEOS) and O$_3$ or a plasma CVD method inducing a reaction between TEOS and O$_2$. Then, a contact hole having a diameter of 0.8 μm is opened on the Pt upper electrode 10a and the source/drain regions 4 by a known photolithography and dry etching method. As a result, a first interlayer insulating film 6a, first diffusion barrier film 11a and second interlayer insulating film 12 are shaped.

Then, an Al film having a thickness of about 700 nm is laid on the whole surface of the wafer by the DC magnetron sputtering method. Then, the Al film is processed by the known photolithography and the dry etching method to form a first metal wiring 13.

Figure 1E:
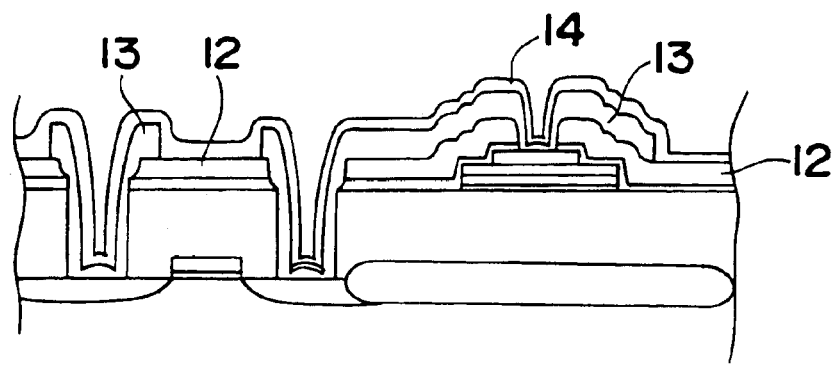

Subsequently, as shown in FIG. 1E, a first buffer film 14 is formed so as to cover the second interlayer insulating film 12 and the first metal wiring 13. This first buffer film 14 is formed to a film thickness of 100–300 nm by the atmospheric CVD method utilizing the reaction between TEOS and ozone or the plasma CVD method utilizing the reaction between TEOS and either O$_2$ or N$_2$O.

Figure 1F:
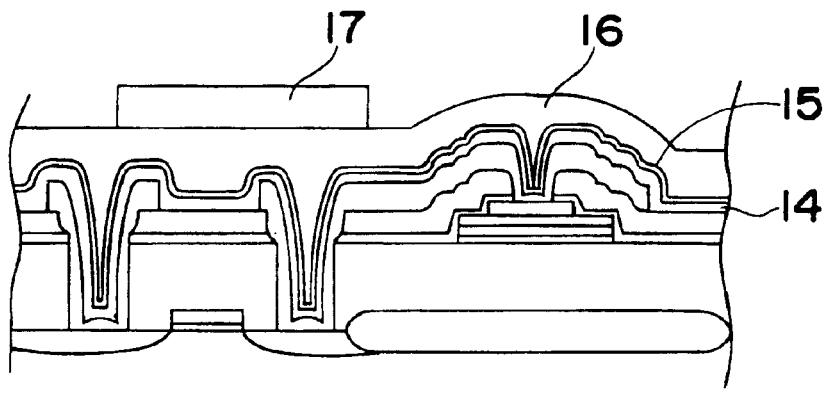

Subsequently, as shown in FIG. 1F, a second diffusion barrier film 15 is formed on the first buffer film 14. This second diffusion barrier film 15 is formed from an oxide of Al or a nitride of Al. Furthermore, the thickness of the second diffusion barrier film 15 is made between 10 nm and 100 nm inclusive, and the substrate temperature when the second diffusion barrier film 15 is formed is set at 100–400° C.

Subsequently, a third interlayer insulating film 16 having a thickness of 600–1000 nm made of a Si oxide film is formed on the second diffusion barrier film 15 by the atmospheric CVD method in which a reaction takes place between TEOS and ozone or the plasma CVD method in which a reaction takes place between TEOS or SiH$_4$ and O$_2$.

Subsequently, after a via hole (not shown) is opened by the known photolithography and the dry etching method, an Al film having a thickness of 700 nm is formed by the DC magnetron sputtering method. Subsequently, the Al film is processed by the photolithography and the dry etching method to form a second metal wiring 17.

Figure 1G:
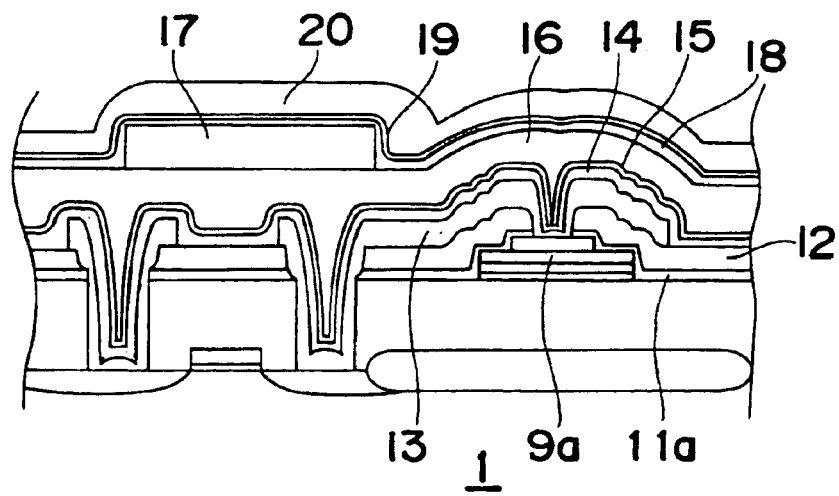

Subsequently, as shown in FIG. 1G, a second buffer film 18 having a thickness of 100–300 nm is formed so as to cover the second metal wiring 17 and the third interlayer insulating film 16. This second buffer film 18 is formed by an atmospheric CVD method inducing a reaction between TEOS and ozone or a plasma CVD method inducing a reaction between TEOS and O$_2$ or N$_2$O.

Then, a diffusion barrier 19 made of an oxide of Al or a nitride of Al is formed on the second buffer film 18.

Finally, a surface protection film 20 made of a SiN film having a thickness of 500 nm is formed on the third diffusion barrier film 19 by a known plasma CVD method.

Thus, since the second and third diffusion barrier films 15, 19 are formed on the first and second metal wirings 13, 17 via the first and second buffer films 14, 18, uniformity in the thickness of the second and third diffusion barrier films 15, 19 becomes favorable, and, even if the thickness of the second and third diffusion barrier films 15, 19 is not increased, diffusion of hydrogen from above the second and third diffusion barrier films 15, 19 towards the ferroelectric film 9a can be reliably prevented by the second and third diffusion barrier films 15, 19. Therefore, the ferroelectric film 9a is not adversely affected by hydrogen, and hence deterioration of the ferroelectric film 9a can be prevented.

Furthermore, since the thickness of the second and third diffusion barrier films 15, 19 is not large, reliability of the first and second metal wirings 13, 17 is not deteriorated.

In the semiconductor memory device thus fabricated, a ferroelectric characteristic of the memory cell was measured by using a known Sawyer tower circuit. As a result, values of the remanent polarization Pr=12 μC/cm$^2$ and the coercive electric field Ec=40 KV/cm were obtained. That is, an operation sufficient as a capacitor of a semiconductor memory device was confirmed.

In the above Embodiment 1, a semiconductor memory device which is a ferroelectric memory device having two-layered Al wiring has been explained, but the present invention is not limited to this example and may be a semiconductor memory device having Al wiring in three or more layers. Furthermore, the semiconductor memory device of the above Embodiment 1 may have one-layer Al wiring. To be brief, the semiconductor memory device of the above Embodiment 1 may have single-layer or multiple-layer metal wirings.

Furthermore, in the above Embodiment 1, the ferroelectric film 9a is formed from SBT, but the present invention is not limited to this example. The ferroelectric film may be formed from, for example, PZT, Bi$_4$Ti$_3$O$_{12}$, BaTiO$_3$, LiNbO$_3$, LiTaO$_3$, YMnO$_3$ or Sr$_2$NbO$_7$.

Furthermore, in the above Embodiment 1, Pt is used as a material of the electrodes, but the present invention is not limited to this example. Materials such as PtRh, PtRhO$_x$, Ir, IrO$_2$, RuO$_2$, RhO$_x$ or LaSrCoO$_3$ may be used.

Furthermore, it is needless to say that the source of the ferroelectric film 9a is not limited to that of this embodiment.

Furthermore, the first, second and third diffusion barrier films 11, 15, 19 are not limited to an oxide of Al or a nitride of Al, but the same barrier effect can also be obtained by using an oxynitride of Al, oxide of Ta, oxynitride of Ta, oxide of Ti or oxide of Zr. That is, the diffusion barrier film may be formed by using any one of oxynitride of Al, oxide of Ta, oxynitride of Ta, oxide of Ti and oxide of Zr.

Furthermore, it is sufficient that the first and second buffer films 14, 18 are made of any one of a compound of Si and oxygen, a compound of Si and nitrogen and a compound of Si, nitrogen and oxygen.

Furthermore, as the selection transistor, for example, a MOS (Metal Oxide semiconductor) transistor or the like may be used.

The semiconductor memory device according to this embodiment is nonvolatile since it has a ferroelectric film 9a.

(Embodiment 2)

FIGS. 2A–2G are cross sectional views showing fabricating process steps for a semiconductor memory device according to Embodiment 2 of the present invention. This semiconductor memory device is a stack-type ferroelectric memory device using two-layer Al wirings.

Hereafter, a method of fabricating this semiconductor memory device will be explained with reference to FIGS. 2A–2G.

Figure 2A:
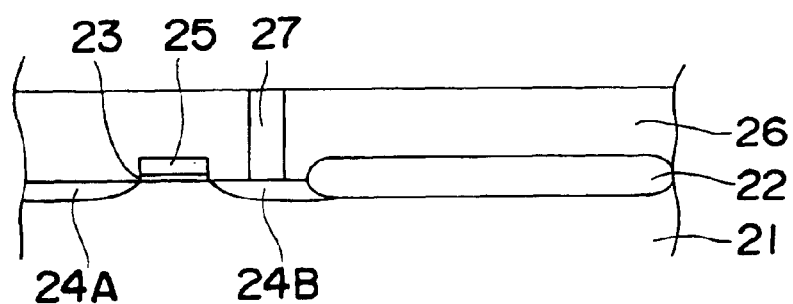
FIGS. 2A–2G are cross sectional views showing fabricating processes of a semiconductor memory device according to Embodiment 2 of the present invention.

First, as shown in FIG. 2A, a device isolation region 22, a gate oxide film 23 of a selection transistor, a drain region 24A of the selection transistor, a source region 24B of the selection transistor, a gate electrode 25 to be used as a word line are successively formed on a conductive silicon substrate 21 by a known method, and then the whole surface of the thus obtained wafer is covered with a first interlayer insulating film made of a known BPSG film. The first interlayer insulating film is planarized by a known chemical mechanical polishing method.

Subsequently, after a contact hole having a diameter of 0.3 $\mu$m is opened in the first interlayer insulating film on the source region 24B of the selection transistor, a polysilicon to which phosphorus is added is formed 300 nm or thicker and polished by the known chemical mechanical polishing method so that the polysilicon remains only in the contact hole to form a plug 27 infilling the contact hole. Consequently, a first interlayer insulating film 26 having the plug 27 is completed.

Figure 2B:
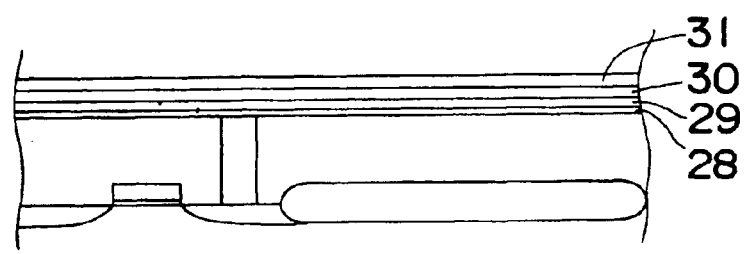

Subsequently, a Ti film having a thickness of 20 nm and a TiN film having a thickness of 50–100 nm are stacked by the DC magnetron sputtering method to form a TiN/Ti film 28 composed of the Ti film and the TiN film, as shown in FIG. 2B,. Then, a Pt film 29 having a thickness of 200 nm is formed on the TiN film 28 to form a lower electrode of a ferroelectric capacitor. Then, the same treatment as in the above Embodiment 1 is performed to form a ferroelectric film 30 from SBT on the Pt film 29 and further form a Pt film 31 on the ferroelectric film 30.

Figure 2C:
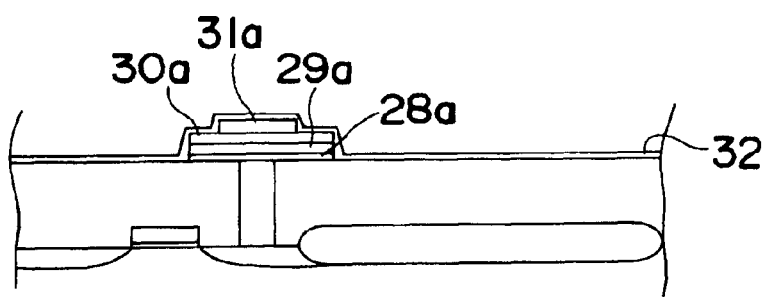

Subsequently, the Pt film 31 is processed into a 1.5 $\mu$m by 1.5 $\mu$m square by a known photolithography method using a photoresist and a dry etching method to form a Pt upper electrode 31a to be used as a capacitor electrode, as shown in FIG. 2C. Then, a thermal treatment is performed in an electric heating furnace at 700–800° C. in an oxygen atmosphere.

Subsequently, the TiN/Ti film 28, Pt film 29 and ferroelectric film 30 are processed by the photolithography method using a photoresist and the dry etching method to obtain a TiN/Ti film 28a, a Pt lower electrode 29a and a ferroelectric film 30a.

Subsequently, in order to prevent diffusion of $H_2$, a first diffusion barrier film 32 made of an oxide of Al or a nitride of Al is formed to cover the ferroelectric capacitor composed of the Pt lower electrode 29a, ferroelectric film 30a and Pt upper electrode 31a with the first diffusion barrier film 32.

Figure 2D:
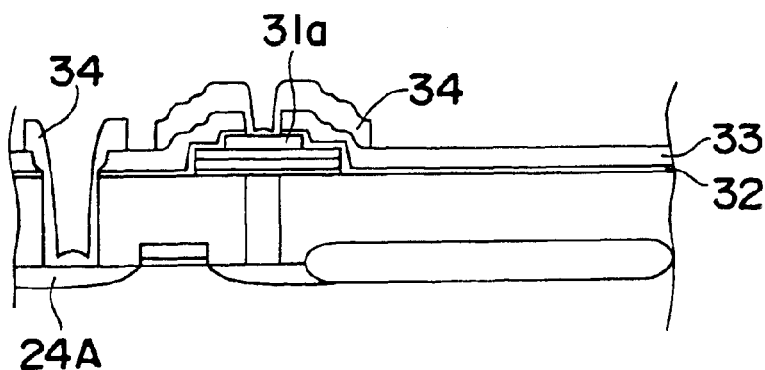

Subsequently, as shown in FIG. 2D, a second interlayer insulating film 33 is formed on the first diffusion barrier film 32 covering the ferroelectric capacitor. A contact hole is opened on the Pt upper electrode 31a and the drain region 24A by the known photolithography method and dry etching method. Then, an Al film having a thickness of 700 nm is formed by the DC magnetron sputtering method. The Al film is processed by the known photolithography and dry etching method to form a first metal wiring 34.

Figure 2E:
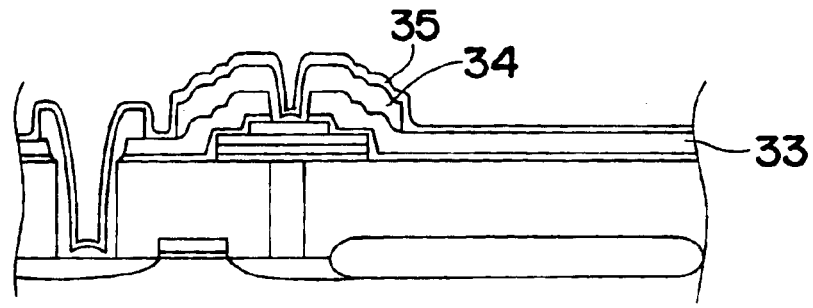

Subsequently, as shown in FIG. 2E, a first buffer film 35 is formed so as to cover the first metal wiring 34 and the second interlayer insulating film 33. This first buffer film 35 is formed by an atmospheric CVD method inducing a reaction between TEOS and ozone or a plasma CVD method inducing a reaction between TEOS and $O_2$ or $N_2O$, and the film thickness of the film is set to be 100–300 nm.

Figure 2F:
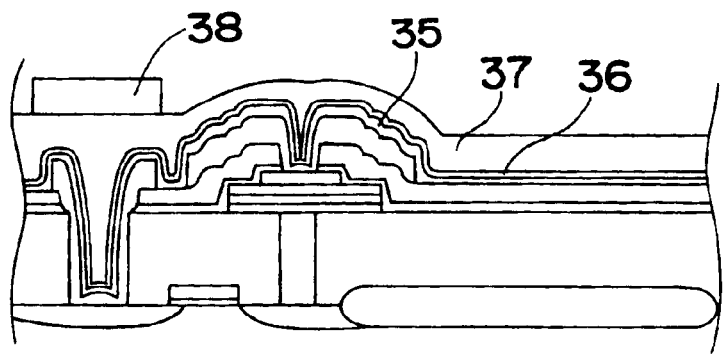

Subsequently, as shown in FIG. 2F, a second diffusion barrier film 36 is formed on the first buffer film 35. This second diffusion barrier film 36 is formed from an oxide of Al or a nitride of Al. Furthermore, the thickness of the second diffusion barrier film 36 is made between 10 nm and 100 nm inclusive, and the substrate temperature at which the second diffusion barrier film 36 is formed is set at 100–400° C.

Subsequently, a third interlayer insulating film 37 made of a Si oxide film having a thickness of 600–1000 nm is formed on the second diffusion barrier film 36 by an atmospheric CVD method inducing a reaction between TEOS and ozone or a plasma CVD method inducing a reaction between TEOS or $SiH_4$ and $O_2$.

Then, after a via hole (not shown) is opened by the known photolithography and dry etching method, an Al film having a thickness of 700 nm is formed by the DC magnetron sputtering method. Subsequently, the Al film is processed by the known photolithography and dry etching method to form a second metal wiring 38.

Figure 2G:
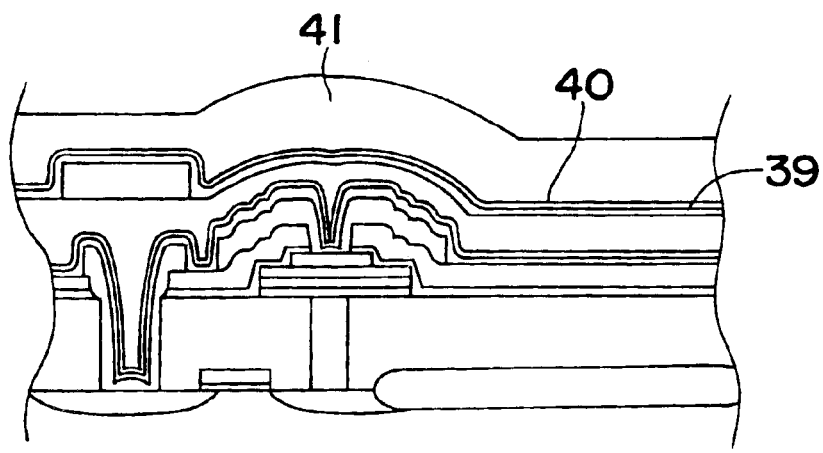

Subsequently, as shown in FIG. 2G, a second buffer film 39 having a thickness of 100–300 nm is formed by the atmospheric CVD method allowing TEOS and ozone to react or the plasma CVD method allowing TEOS and $O_2$ or $N_2O$ to react so as to cover the second metal wiring 38 and the third interlayer insulating film 37.

Then, a diffusion barrier 40 made of an oxide of Al or a nitride of Al is formed on the second buffer film 39.

Finally, a surface protection film 41 made of a SiN film having a thickness of 500 nm is formed on the third diffusion barrier film 40 by the known plasma CVD method.

As described above, since the second and third diffusion barrier films 36, 40 are formed on the first and second metal wirings 34, 38 via the first and second buffer films 35, 39, uniformity in the thickness of the second and third diffusion barrier films 36, 40 becomes favorable, and, even if the thickness of each of the second and third diffusion barrier films 36, 40 is not increased, diffusion of hydrogen from above the second and third diffusion barrier films 36, 40 towards the ferroelectric film 30a can be reliably prevented by the second and third diffusion barrier films 36, 40. Therefore, the ferroelectric film 30a is not adversely affected by hydrogen, and hence deterioration of the ferroelectric film 30a can be prevented.

Furthermore, since the thickness of the second and third diffusion barrier films 36, 40 is not increased, reliability of the first and second metal wirings 34, 38 is not deteriorated.

In the semiconductor memory device thus fabricated, a ferroelectric characteristic of the memory cell was measured by using the known Sawyer tower circuit. As a result, values of the remanent polarization Pr=11.5 $\mu C/cm^2$ and the coercive electric field Ec=39 KV/cm were obtained. That is, an operation sufficient as a capacitor of a semiconductor memory device was confirmed.

In the above Embodiment 2, a semiconductor memory device which is a ferroelectric memory device having two-layer Al wirings has been explained, but the present invention is not limited to this example and may be a semiconductor memory device which is a ferroelectric memory device having Al wirings in three or more layers. Furthermore, the semiconductor memory device of the above Embodiment 2 may have one-layer Al wirings. To be brief, the semiconductor memory device of the above Embodiment 2 may have single-layer or multiple-layer metal wirings.

Furthermore, in the above Embodiment 2, the ferroelectric film 30a is formed by using SBT, but the present invention is not limited to this example. The ferroelectric film may be formed by using, for example, PZT, $Bi_4Ti_3O_{12}$, $BaTiO_3$, $LiNbO_3$, $LiTaO_3$, $YMnO_3$ or $Sr_2NbO_7$.

Furthermore, in the above Embodiment 2, Pt is used as a material of the electrodes, but the present invention is not limited to this example. Other materials such as PtRh, $PtRhO_x$, Ir, $IrO_2$, $RuO_2$, $RhO_x$ or $LaSrCoO_3$ may be used.

Furthermore, a TaSiN film, TiAlN film or TiSiN film may be used instead of the TiN film 28.

Furthermore, the first, second and third diffusion barrier films 32, 36, 40 are not limited to an oxide of Al or a nitride of Al, but the same barrier effect can also be obtained by using an oxynitride of Al, an oxide of Ta, an oxynitride of Ta, an oxide of Ti or an oxide of Zr. That is, the diffusion barrier film may be formed by using any one of an oxynitride of Al, an oxide of Ta, an oxynitride of Ta, an oxide of Ti and an oxide of Zr.

Furthermore, it is sufficient that the first and second buffer films 35, 39 are made of any one of a compound of Si and oxygen, a compound of Si and nitrogen and a compound of Si, nitrogen and oxygen.

Furthermore, as the selection transistor, for example, a MOS transistor or the like may be used.

(Embodiment 3)

FIGS. 3A–3I are cross sectional views showing process steps for fabricating a semiconductor memory device according to Embodiment 3 of the present invention. This semiconductor memory device is a stack-type high dielectric memory device using two-layer Al wirings.

Hereafter, a method of fabricating this semiconductor memory device is explained with reference to FIGS. 3A–3I.

Figure 3A:
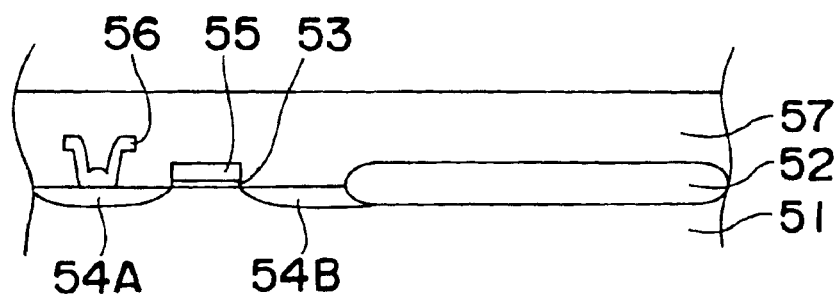
FIGS. 3A–3I are cross sectional views showing fabricating processes of a semiconductor memory device according to Embodiment 3 of the present invention.

First, as shown in FIG. 3A, a device isolation region 52, a gate oxide film 53 of a selection transistor, a drain region 54A of the selection transistor, a source region 54B of the selection transistor, a gate electrode 55 to be used as a word line, and a bit line 56 are successively formed on a conductive silicon substrate 51 by a known method, and then the whole surface of the thus obtained wafer is covered with a first interlayer insulating film 57 made of a known BPSG film. The first interlayer insulating film 57 is then planarized by a known chemical mechanical polishing method.

Figure 3B:
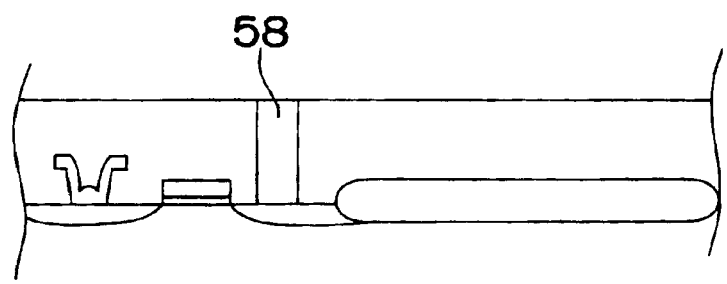

Subsequently, after a contact hole having a diameter of 0.3 µm is opened in the first interlayer insulating film 57 on the source region 54B of the selection transistor, a phosphorus-added polysilicon is deposited 300 nm or thicker and polished by the known chemical mechanical polishing method so that the polysilicon remains only in the contact hole to form a plug 58 for infilling the contact hole as shown in FIG. 3B.

Figure 3C:
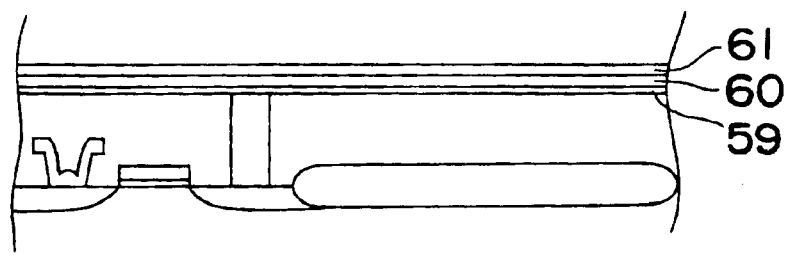

Subsequently, as shown in FIG. 3C, a Ti film 59 having a thickness of 20 nm is formed by a DC magnetron sputtering method, and then a TiN film 60 having a thickness of 100 nm is formed by the DC magnetron sputtering method. Then, a Pt film 61 having a thickness of 200 nm is formed on the TiN film 60 to form a lower electrode of a high dielectric capacitor.

Figure 3D:
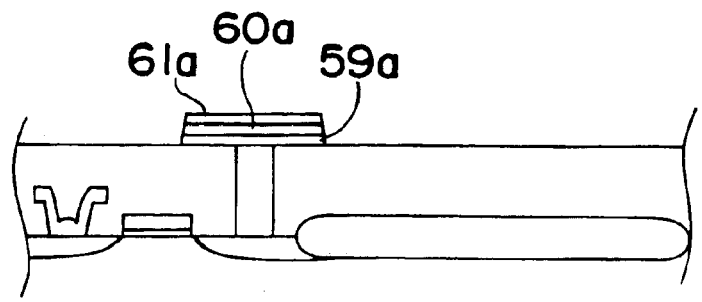

Subsequently, the Pt film 61 is processed into a piece 0.3 µm square by a known photolithography using a photoresist and a dry etching method to form a Pt lower electrode 61a of the high dielectric capacitor, as shown in FIG. 3D. Then, the Ti film 59 and the TiN film 60 are processed into a Ti film 59a and a TiN film 60a.

Figure 3E:
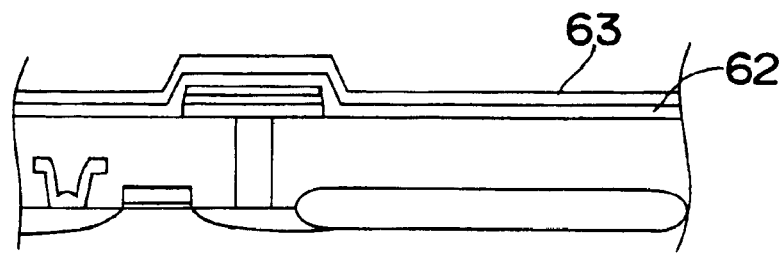

Subsequently, as shown in FIG. 3E, a high dielectric film 62 made of barium strontium titanate (hereinafter, referred to as $(Ba_xSr_{1-x})TiO_3$ ($x \leq 1$)) having a thickness of 30 nm is formed on the whole surface of the wafer. Then, a Pt film 63 having a thickness of 100 nm is formed on the high dielectric film 62 to form an upper electrode of the high dielectric capacitor.

Figure 3F:
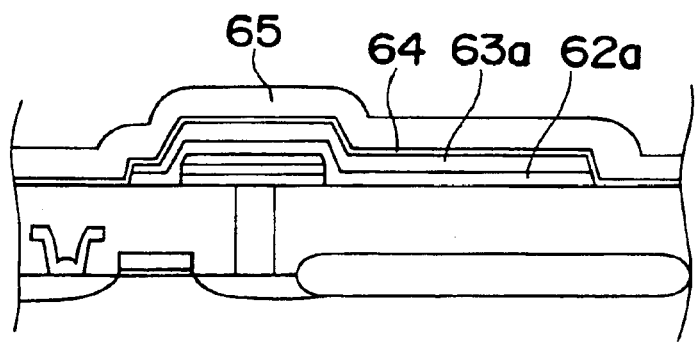

Subsequently, by the known photolithography using a photoresist and the dry etching method, the Pt film 63 and the high dielectric film 62 in only a memory cell region is processed by using the same mask to form a Pt upper electrode 63a and a high dielectric film 62a, as shown in FIG. 3F. In this case, in forming the Pt upper electrode 63a and the high dielectric film 62a, a $Cl_2$ gas is typically used as an etching gas and a high-frequency bias is applied to the substrate, or wafer, under a pressure of 1.5 mTorr.

Subsequently, in the same manner as in Embodiments 1 and 2, a first diffusion barrier film 64 made of an oxide of Al or a nitride of Al is formed so as to cover the Pt upper electrode 63a and the high dielectric film 62a.

Subsequently, a second interlayer insulating film 65 made of an oxide film having a film thickness 500–600 nm is formed on the diffusion barrier film 64 by an atmospheric CVD method utilizing the reaction between TEOS and $O_3$ or a plasma CVD method utilizing the reaction between TEOS and $O_2$.

Figure 3G:
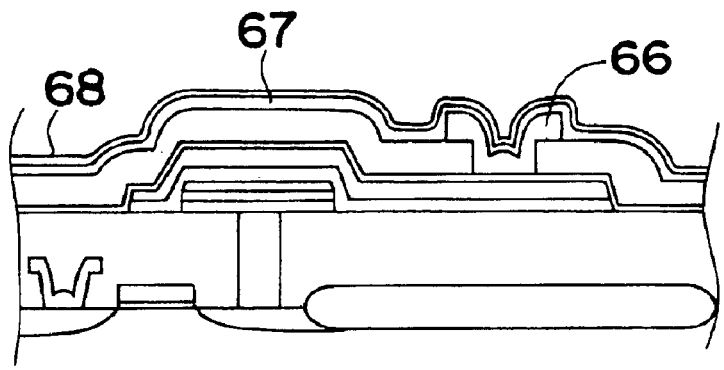

Subsequently, after a contact hole having a diameter of 0.25 µm is opened on the Pt upper electrode 63a and the bit line 56 by the known photolithography method and the dry etching method, an Al film having a thickness of 700 nm is deposited by the DC magnetron sputtering method. Then, the Al film is processed by the known photolithography method and dry etching method to form a first metal wiring 66, as shown in FIG. 3G.

Subsequently, a first buffer film 67 is formed so as to cover the first metal wiring 66 and the second interlayer insulating film 65. This first buffer film 67 is formed by the atmospheric CVD method utilizing the reaction between TEOS and ozone or the plasma CVD method utilizing the reaction between TEOS and $O_2$ or $N_2O$ so as to have a film thickness of 100–300 nm.

Subsequently, a second diffusion barrier film 68 made of an oxide of Al or a nitride of Al is formed on the first buffer film 67. The film thickness of this second diffusion barrier film 68 is made between 10 nm and 100 nm inclusive, the substrate temperature at which the second diffusion barrier film 68 is formed is set at 100–400° C.

Figure 3H:
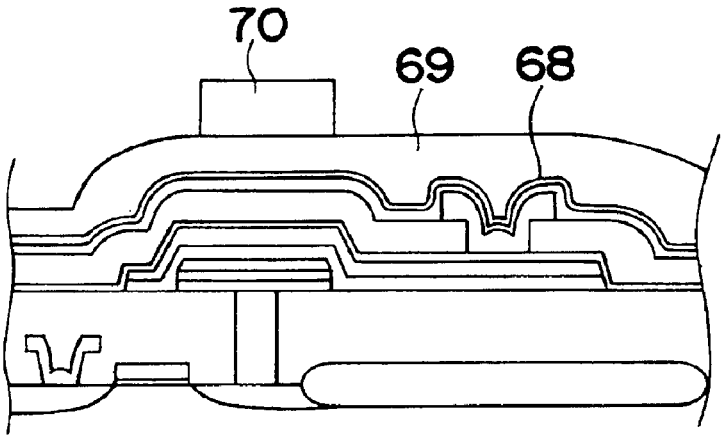

Subsequently, as shown in FIG. 3H, a third interlayer insulating film 69 made of a Si oxide film having a thickness of 600–1000 nm is formed on the second diffusion barrier film 68 by the atmospheric CVD method utilizing the reaction between TEOS and ozone or the plasma CVD method utilizing the reaction between TEOS or $SiH_4$ and $O_2$.

Subsequently, after a via hole (not shown) is opened in the third interlayer insulating film 69 by the known photolithography method and dry etching method, an Al film having a thickness of 700 nm is formed by the DC magnetron sputtering method. Subsequently, the Al film is processed by the photolithography method and dry etching method to form a second metal wiring 70 on the third interlayer insulating film 69.

Figure 3I:
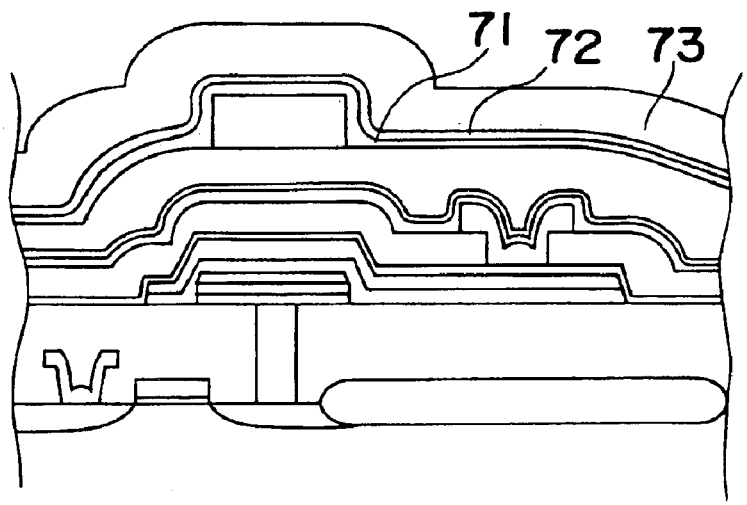
Figure 4:
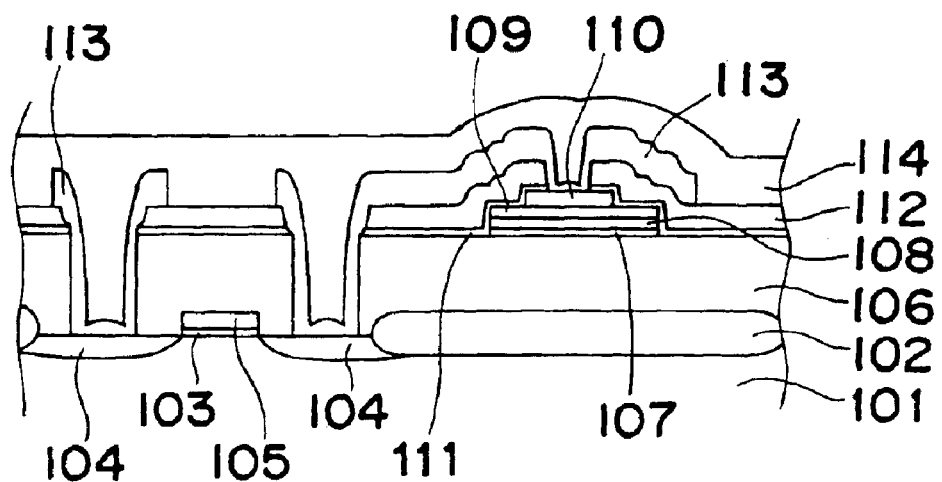
FIG. 4 is a cross sectional view showing a conventional semiconductor memory device.
Figure 5:
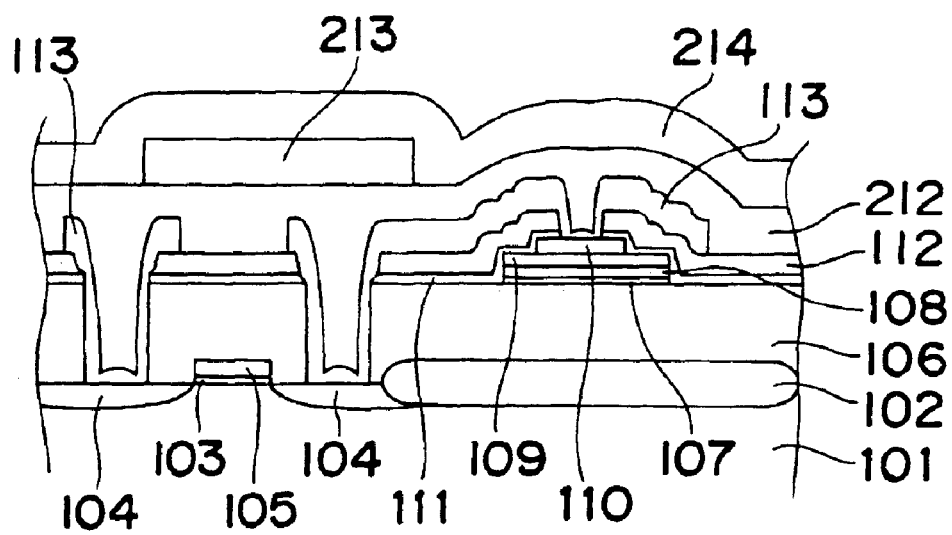
FIG. 5 is a cross sectional view showing another conventional semiconductor memory device.

Subsequently, as shown in FIG. 3I, a second buffer film 71 having a thickness of 100–300 nm is formed by the atmospheric CVD method utilizing the reaction between TEOS and ozone or the plasma CVD method utilizing the reaction between TEOS and $O_2$ or $N_2O$ so as to cover the second metal wiring 70 and the third interlayer insulating film 69 with the second buffer film 71. Then, a third diffusion barrier film 72 made of an oxide of Al or a nitride of Al is formed on the second buffer film 71.

Finally, a surface protection film 73 made of a SiN film having a thickness of 500 nm is formed on the third diffusion barrier film 72 by a known plasma CVD method.

As described above, since the second and third diffusion barrier films 68, 72 are formed on the first and second metal wirings 66, 70 via the first and second buffer films 67, 71, uniformity in the thickness of the second and third diffusion barrier films 68, 72 becomes favorable, and, even if the thickness of the second and third diffusion barrier films 68, 72 is not increased, diffusion of hydrogen from above the second and third diffusion barrier films 68, 72 towards the high dielectric film 62a is reliably prevented by the second and third diffusion barrier films 68, 72. Therefore, the high dielectric film 62a is not adversely affected by hydrogen, and hence deterioration of the high dielectric film 62a can be prevented.

Furthermore, since the thickness of each of the second and third diffusion barrier films 68, 72 is not large, reliability of the first and second metal wirings 66, 70 is not deteriorated.

In the semiconductor memory device thus fabricated, the polarization value of the memory cell was 10 $\mu$C/cm$^2$ at an applied voltage of 1 V, which value is favorable. Furthermore, the leakage current was 1×10$^8$ A/cm$^2$, which was also favorable, at applied voltages up to ±2 V.

In the above Embodiment 3, a semiconductor memory device which is a high dielectric memory device having two-layer Al wirings has been explained, but the present invention is not limited to this example and may be a semiconductor memory device having Al wirings in three or more layers. Furthermore, the semiconductor memory device of the above Embodiment 3 may have one-layer Al wirings. To be brief, the semiconductor memory device of the above Embodiment 3 may have single-layer or multiple-layer metal wirings.

Furthermore, in the above Embodiment 3, the high dielectric film 62a is formed by using (Ba$_x$Sr$_{1-x}$) TiO$_3$, but the present invention is not limited to this example. The high dielectric film may be formed by using, for example, Ta$_2$O$_5$, SrTiO$_3$ or the like.

Furthermore, in the above Embodiment 3, Pt is used as a material of the electrodes, but the present invention is not limited to this example. For example, PtRh, PtRhO$_x$, Ir, IrO$_2$, RuO$_2$, RhO$_x$ or LaSrCoO$_3$ may also be used as a material of the electrode.

Furthermore, a TiAlN film or a TiSiN film may be used instead of the TiN film 60.

Furthermore, Pt is used as a material of the lower electrode of the high dielectric capacitor, but ruthenium oxide may be used instead of Pt.

Furthermore, the first, second and third diffusion barrier films 64, 68, 72 are not limited to an oxide of Al or a nitride of Al, but the same barrier effect can also be obtained by using an oxynitride of Al, an oxide of Ta, an oxynitride of Ta, an oxide of Ti, or an oxide of Zr. That is, instead of using an oxide of Al or a nitride of Al, the diffusion barrier films may be formed by using any one of an oxynitride of Al, an oxide of Ta, an oxynitride of Ta, an oxide of Ti, and an oxide of Zr.

Furthermore, it is sufficient that the first and second buffer films 67, 71 are made of any one of a compound of Si and oxygen, a compound of Si and nitrogen, and a compound of Si, nitrogen and oxygen.

Furthermore, as the selection transistor, for example, a MOS transistor or the like may be used.

(Embodiment 4)

In the semiconductor memory devices of Embodiments 1 and 2 and the semiconductor memory device of Embodiment 3, after the first diffusion barrier film 11, 32, 64, second diffusion barrier film 15, 36, 68 and third diffusion barrier film 19, 40, 72 are formed, a thermal treatment is performed in the electric heating furnace at a temperature between 300° C. and 450° C. inclusive in an ambient of oxygen, nitrogen, or a mixed gas thereof for 30–60 minutes inclusive. As a result of the thermal treatment, the first diffusion barrier film 11, 32, 64, second diffusion barrier film 15, 36, 68 and third diffusion barrier film 19, 40, 72, which are amorphous or of microcrystals composed of grains of 5 nm or smaller after the formation of the films, come to have a stoichiometric composition ratio for a stable film composition. Also, denseness and insulativity of the films are improved. Thus, favorable barrier property against hydrogen diffusion is obtained.

Furthermore, as mentioned before, the first diffusion barrier film 11, 32, 64, second diffusion barrier film 15, 36, 68 and third diffusion barrier film 19, 40, 72 are not limited to an oxide of Al or a nitride of Al, but the same barrier effect can be obtained by using an oxynitride of Al, an oxide of Ta, an oxynitride of Ta, an oxide of Ti, or an oxide of Zr. Even when these alternative materials are used for the first, second, and third diffusion barrier films, performing the aforementioned thermal treatment after film formation proved to remarkably improve the diffusion barrier property of these films. When the thermal treatment was performed for all the diffusion barrier films or at least one of the diffusion barrier films, deterioration due to hydrogen was prevented.

When the diffusion barrier film is made of an oxide of Al, a nitride of Al, or an oxynitride of Al, the film has a refractive index of 1.60 or higher but lower than 1.75.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
   a semiconductor substrate;
   a dielectric capacitor that is formed on the semiconductor substrate and has a dielectric film;
   a first diffusion barrier film covering the dielectric capacitor;
   an insulating film formed on the first diffusion barrier film;
   a first metal wiring formed on the insulating film;
   a first buffer film covering the first metal wiring; and
   a second diffusion barrier film formed on the first buffer film, wherein the second diffusion barrier film is thinner than the first buffer film.

2. The semiconductor memory device according to claim 1, wherein the dielectric film is a ferroelectric film formed by using any one of (Pb$_x$La$_{1-x}$) (Zr$_y$Ti$_{1-y}$)O$_3$ (0≤x, y≤1), Bi$_4$Ti$_3$O$_{12}$, BaTiO$_3$, LiNbO$_3$, LiTaO$_3$, YMnO$_3$, Sr$_2$Nb$_2$O$_7$, and SrBi$_2$ (Ta$_x$Nb$_{1-x}$)$_2$O$_9$ (0≤x≤1).

3. The semiconductor memory device according to claim 1, wherein the dielectric film is a high dielectric film formed by using any one of SrTiO$_3$, (Ba$_x$Sr$_{1-x}$)TiO$_3$ (x ≤1), and Ta$_2$O$_5$.

4. The semiconductor memory device according to claim 1, wherein the thickness of the buffer film is 100–300 nm.

5. The semiconductor memory device according to claim 1, further comprising:
   an insulating film formed on the second diffusion barrier film;
   a second metal wiring formed on the insulating film on the second diffusion barrier film;
   a second buffer film covering the second metal wiring; and
   a third diffusion barrier film formed on the second buffer film.

6. The semiconductor memory device according to claim 5, wherein each of the buffer films comprises an insulating film made of any one of a compound of Si and oxygen, a compound of Si and nitrogen, and a compound of Si, nitrogen and oxygen.

7. The semiconductor memory device according to claim 6, wherein Si(OC$_2$H$_5$)$_4$ is used as a Si source.

8. The semiconductor memory device according to claim 5, wherein each of the diffusion barrier films is formed from any one of an oxide of Al, a nitride of Al, an oxynitride of Al, an oxide of Ta, an oxynitride of Ta, an oxide of Ti, and an oxide of Zr.

9. The semiconductor memory device according to claim 8, wherein each diffusion barrier film has a thickness of between 10 nm and 100 nm inclusive; and each diffusion barrier film is amorphous or comprises grains having a grain size of 5 nm or smaller.

10. The semiconductor memory device according to claim 5, wherein each diffusion barrier film has a refractive index of 1.60 or higher but lower than 1.75, and comprises any one of an oxide of Al, a nitride of Al, and an oxynitride of Al.

11. The semiconductor memory device according to claim 5, wherein the thickness of each buffer film is 100–300 nm.

12. The semiconductor memory device according to claim 1, wherein the buffer film is an insulating film made of any one of a compound of Si and oxygen, compound of Si and nitrogen and compound of Si, nitrogen and oxygen.

13. The semiconductor memory device according to claim 12, wherein $Si(OC_2H_5)_4$ is used as a Si source.

14. The semiconductor memory device according to claim 1, wherein each of the diffusion barrier films is formed from any one of an oxide of Al, a nitride of Al, an oxynitride of Al, an oxide of Ta, an oxynitride of Ta, an oxide of Ti, and an oxide of Zr.

15. The semiconductor memory device according to claim 14, wherein each diffusion barrier film has a thickness of between 10 nm and 100 nm inclusive; and each diffusion barrier film is amorphous or comprises grains having a grain size of 5 nm or smaller.

16. A semiconductor memory device comprising:

a semiconductor substrate;

a dielectric capacitor that is formed on the semiconductor substrate and comprises a dielectric film;

a first diffusion barrier film covering the dielectric capacitor;

an insulating film formed on the first diffusion barrier film;

a first wiring formed on the insulating film;

a first buffer film covering the first wiring;

a second diffusion barrier film formed on the first buffer film; and wherein each diffusion barrier film has a refractive index of 1.60 or higher but lower than 1.75, and comprises any one of an oxide of Al, a nitride of Al, and an oxynitride of Al.

17. The semiconductor memory device according to claim 16, further comprising:

an insulating film formed on the second diffusion barrier film;

a second metal wiring formed on the insulating film on the second diffusion barrier film;

a second buffer film covering the second metal wiring; and a third diffusion barrier film formed on the second buffer film.

18. A semiconductor memory device comprising:

a semiconductor substrate;

a dielectric capacitor that is formed on the semiconductor substrate and comprises a dielectric film;

a first diffusion barrier film covering the dielectric capacitor;

an insulating film formed on the first diffusion barrier film;

a first wiring formed on the insulating film;

a first buffer film covering the first wiring;

a second diffusion barrier film formed on the first buffer film; and wherein the second diffusion barrier film is from 10 to 100 nm thick, and is amorphous or comprises grains having a grain size of 5 nm or smaller.

19. The semiconductor memory device according to claim 18, further comprising:

an insulating film formed on the second diffusion barrier film;

a second metal wiring formed on the insulating film on the second diffusion barrier film;

a second buffer film covering the second metal wiring; and a third diffusion barrier film formed on the second buffer film.

* * * * *